(12) United States Patent
Lof et al.

(10) Patent No.: US 6,936,385 B2
(45) Date of Patent: Aug. 30, 2005

(54) CALIBRATION METHODS, CALIBRATION SUBSTRATES, LITHOGRAPHIC APPARATUS AND DEVICE MANUFACTURING METHODS

(75) Inventors: Joeri Lof, Eindhoven (NL); Henricus Wilhelmus Maria Van Buel, Eindhoven (NL); Cheng-Qun Gui, Best (NL); Fransiscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 174 days.

(21) Appl. No.: 10/374,510

(22) Filed: Feb. 27, 2003

(65) Prior Publication Data

US 2003/0224262 A1 Dec. 4, 2003

(30) Foreign Application Priority Data

Mar. 1, 2002 (EP) ............................................ 02251440

(51) Int. Cl.⁷ ............................. G03F 9/00; G03C 5/00; G01B 11/00; G03B 27/42
(52) U.S. Cl. ............................. 430/22; 430/30; 355/53; 355/77; 356/399; 356/400; 356/401; 438/401
(58) Field of Search ...................... 430/22, 30; 355/53, 355/77; 356/399–401; 438/401

(56) References Cited

U.S. PATENT DOCUMENTS

| 4,798,470 A | 1/1989 | Moriyama et al. |
|---|---|---|
| 4,867,566 A | 9/1989 | Straayer et al. |
| 4,952,060 A | 8/1990 | Ina et al. |
| 5,361,132 A | 11/1994 | Farn |
| 5,481,362 A | 1/1996 | Van Den Brink et al. |
| 5,843,831 A | 12/1998 | Chung et al. |
| 5,929,997 A | 7/1999 | Lin |
| 6,237,393 B1 | 5/2001 | Ames et al. |
| 6,340,821 B1 | 1/2002 | Brown |
| 6,768,539 B2 * | 7/2004 | Gui et al. ...................... 355/53 |

FOREIGN PATENT DOCUMENTS

| EP | 0 756 207 A2 | 1/1997 |
|---|---|---|
| EP | 0 769 726 A2 | 4/1997 |
| EP | 1 223 469 A1 | 7/2002 |
| EP | 1 341 221 A1 | 9/2003 |
| JP | 52-54379 | 5/1977 |
| JP | 53-20865 | 2/1978 |
| JP | 62-160723 | 7/1987 |
| JP | 7-29815 | 1/1995 |
| JP | 9-312248 | 12/1997 |
| JP | 11-340120 | 12/1999 |

OTHER PUBLICATIONS

X–Ray Lithography Mask With Visible Light Transmitting Areas, IBM Technical Disclosure Bulletin, Oct. 1989, Vo. 32, No. 5A. pp. 240–241.

* cited by examiner

Primary Examiner—Christopher G. Young
(74) Attorney, Agent, or Firm—Pillsbury Winthrop Shaw Pittman LLP

(57) ABSTRACT

To calibrate a front-to-backside alignment system a transparent calibration substrate with reference markers on opposite sides is used. A plane plate is inserted to displace the focal position of the alignment system from the top to bottom surface of the calibration substrate.

26 Claims, 6 Drawing Sheets

US 6,936,385 B2

CALIBRATION METHODS, CALIBRATION SUBSTRATES, LITHOGRAPHIC APPARATUS AND DEVICE MANUFACTURING METHODS

This application claims priority to European Patent Application 02251440.0 files Mar. 1, 2002, the entire contents of which are hereby incorporated by reference.

BACKGROUND OF THE INVENTION

1. Field of the Invention

The present invention relates to calibration of lithographic projection apparatus.

2. Description of the Related Art

The term "patterning device" as here employed should be broadly interpreted as referring to device that can be used to endow an incoming radiation beam with a patterned cross-section corresponding to a pattern that is to be created in a target portion of the substrate. The term "light valves" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Alignment is the process of positioning the image of a specific point on the mask to a specific point on the wafer which is to be exposed. Typically one or more alignment marks, such as a small pattern, are provided on each of the substrate and the mask. A device may consist of many layers which are built up by successive exposures with intermediate processing steps. Before each exposure, alignment between the marks on the substrate and the mask is performed to minimize any positional error between the new exposure and the previous ones, which error is termed overlay error.

In some technologies, such as micro systems technology (MST), micro electro-mechanical systems (MEMS), micro opto-electro-mechanical systems (MOEMS) and flip chips, devices are fabricated from both sides of a substrate. There has been a problem with performing exposures on one side of a substrate such that they are accurately aligned with features previously exposed on the other side of the substrate. An alignment accuracy of the order of 0.5 microns or better is typically required.

A front-to-backside alignment (FTBA) system employing an additional twofold set of optical elements embedded in the wafer table has been proposed. In this way a known through-the-lens (TTL) alignment system can determine the position of a marker located on the opposite substrate surface. The FTBA system is also useful to overcome processing problems occurring when topside markers are covered by process layers and can no longer be aligned to. However, deviations from the nominal hardware design, temperature variations, substrate thickness and wedge variations, non-correctable errors of the lens, non-orthogonality of the alignment beams and standard overlay errors affect the accuracy of the FTBA system. Accordingly, there is a need to calibrate the FTBA system to meet the required alignment accuracy.

SUMMARY OF THE INVENTION

It is an aspect of the present invention to provide methods for calibration of a front-to-backside alignment system.

This and other aspects are achieved according to the invention in a method of calibrating an alignment system capable of aligning to alignment markers on opposite sides of a substrate, the alignment system directing an alignment beam of radiation directly onto one side and directing the alignment beam onto the other side via an optical system, the method including providing a calibration substrate having first and second opposite surfaces and being transparent to the radiation of the alignment beam, the calibration substrate having a reference marker on a first surface thereof, the reference marker being detectable from both the first and second surfaces; performing a first alignment to the reference marker with the alignment beam directed onto the first surface; and performing a second alignment to the reference marker with the alignment beam directed onto the second surface and propagating through the calibration substrate to the first surface, whilst a plane plate is interposed into the alignment beam so that a focal position of the alignment system is displaced to the position of the first marker; wherein the first and second alignments may be performed in any order.

This method provides a direct procedure for calibrating a front-to-backside alignment system. Comparison of the results of the three alignment steps provides a calibration of the optical system that re-images the second, backside alignment marker where it is visible to the alignment system. The front-to-backside alignment system can then be used with confidence to align opaque production substrates.

The reference substrate may be provided with a plurality of reference markers on each side so that the alignments may be repeated for each re-imaging optical system of the alignment system.

To average out any wedge (deviation from parallelism) and inhomogeneity of the plane plate, the plane plate is rotated by 180° about an axis substantially parallel to the direction of the alignment beam and about the orthogonal axes parallel to the plane of the substrate. After each rotation, the second alignment is repeated giving four measurements.

The present invention also provides a calibration substrate for use in the method described above and comprising a transparent body having a reference marker on one of two opposite surfaces thereof, the reference marker being detectable from both of the opposite surfaces.

Aspects of the invention are also solved in a method of calibrating an alignment system in a lithographic apparatus capable of aligning to alignment markers on opposite sides of a substrate, the alignment system directing an alignment of radiation directly onto one side and directing the alignment beam onto the other side via an additional optical system, the method including providing a substrate having a pair of first reference markers on a first surface thereof; performing a first alignment to the pair of first reference markers using the additional optical system; performing a first exposure of a pair of second reference markers on a second surface of the substrate; performing a first rotation of the substrate by 180° about a first axis; performing a second alignment to the pair of second reference markers using the additional optical system; performing a second exposure of a pair of third reference markers on the first surface of the substrate; and measuring relative positions of the first and third reference markers to calibrate the alignment system.

The first axis may be the perpendicular bisector of a line joining the pair of first reference markers or the line joining the pair of first reference markers. The calibration is preferably repeated with rotation about both.

Advantageously, both of the calibration methods described above are combined.

Aspects of the invention are also solved in a method of calibrating an alignment system in a lithographic apparatus capable of aligning to alignment markers on opposite sides of a substrate, the alignment system directing an alignment beam of radiation directly onto one side and directing the alignment beam onto the other side via an additional optical system, the method including providing a substrate having a pair of first reference markers on a first surface thereof and a pair of second reference markers on a second surface thereof; performing an alignment to the first reference marks with the alignment beam directed onto the surface, performing an alignment to the second reference marks using the additional optical system; performing a first rotation of the substrate by 180° about a first axis; performing an alignment to the second reference marks with the alignment beam directed onto the surface, performing an alignment to the first reference marks using the additional optical system; and comparing the alignments, wherein the alignments may be performed in any order.

The first axis may be the perpendicular bisector of a line joining the pair of first reference markers or the line joining the pair of first reference markers. The calibration is preferably repeated with rotation about both.

Advantageously, any of the three calibration methods described above may be combined.

Aspects of the invention are also solved in a method of calibrating an alignment system in a lithographic apparatus capable of aligning to alignment markers on opposite sides of a substrate, the alignment system directing an alignment beam of radiation directly onto one side and directing the alignment beam onto the other side via an additional optical system, the method including providing a calibration substrate having a first pair of rows of three or more reference markers on a first surface thereof, and a second pair of rows of three or more reference markers on a second surface thereof; performing an alignment to the first pair of rows of reference marks using the directly incident alignment radiation, and performing an alignment to the second pair of rows of reference marks using the additional optical system; performing a first rotation of the substrate by 180 degrees about a first axis; performing an alignment to the second pair of rows of reference marks using the directly incident alignment radiation, and performing an alignment to the first pair of rows of reference marks using the additional optical system; and comparing the alignments, wherein the alignments may be performed in any order.

Advantageously, this calibration method may be used in combination with any of the three previously described methods.

A lithographic apparatus calibrated using the methods described above can then be used to produce calibration substrates for calibrating other lithographic apparatus.

A second aspect of the present invention provides a lithographic projection apparatus including a radiation system for supplying a beam of radiation; a patterning device constructed and arranged to pattern the beam of radiation according to a desired pattern; a substrate table constructed and arranged to hold a substrate; a projection system constructed and arranged to project the patterned beam onto a target portion on a first side of the substrate; an alignment system employing an alignment beam of radiation to which the substrate is transparent constructed and arranged to align a reference marker on the support system or the patterning device to an alignment marker provided on a first surface of the substrate onto which the patterned beam is to be imaged; and a plane plate selectively interposable into the path of the alignment beam such that the alignment beam is focused onto a second surface of the substrate opposite to the first surface.

This aspect of the invention also provides a device manufacturing method including providing a beam of radiation using a radiation system; using a patterning device to endow the beam of radiation with a pattern in its cross-section; using an alignment system to align a reference marker on a support configured to support the patterning device or the patterning device with a first alignment marker provided on a first surface of the substrate onto which the patterned beam is to be imaged by illuminating the alignment marker with a beam of radiation to which the substrate is transparent; interposing a plane plate into the path of the alignment beam such that the alignment beam is focused onto a second surface of the substrate opposite to the first surface and aligning the reference marker with a second alignment marker provided on a second surface of the substrate opposite the first surface; and projecting the patterned beam of radiation onto a target area of the layer of radiation-sensitive material on a first side of the substrate.

The invention also provides a calibration substrate having a thickness of less than or equal to 10 $\mu$m, at least in the vicinity of an alignment marker, such that the alignment marker is detectable from both sides. The substrate may be provided with a first region having a thickness of less than or equal to 10 $\mu$m and provided with a first alignment marker, and a second region having a thickness of less than or equal to 10 $\mu$m and provided with a second alignment marker, the first and second regions being separated in a direction perpendicular to a plane defined by a surface of the substrate. Advantageously, the separation is greater than 100 $\mu$m.

The invention also provides a method of calibrating a lithographic apparatus including performing the first above described method using the above described substrate having the thickness of less than or equal to 10 mm; rotating the substrate about an axis perpendicular to a plane defined by a surface of the substrate; and performing the method for a second time.

Throughout this specification, reference to an alignment mark being on a particular side of the substrate, of course includes the alignment mark being etched into that side of the substrate, and includes the alignment mark having subsequent material deposited on top of it such that it is embedded and is no longer necessarily exposed at the surface.

In a manufacturing process using a lithographic projection apparatus according to the present invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as being replaced by the more general terms "substrate" and "target area", respectively.

In the present document, the terms illumination radiation and illumination beam are used to encompass all types of electromagnetic radiation, including ultraviolet radiation (e.g. with a wavelength of 365, 248, 193, 157 or 126 nm) and EUV, as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
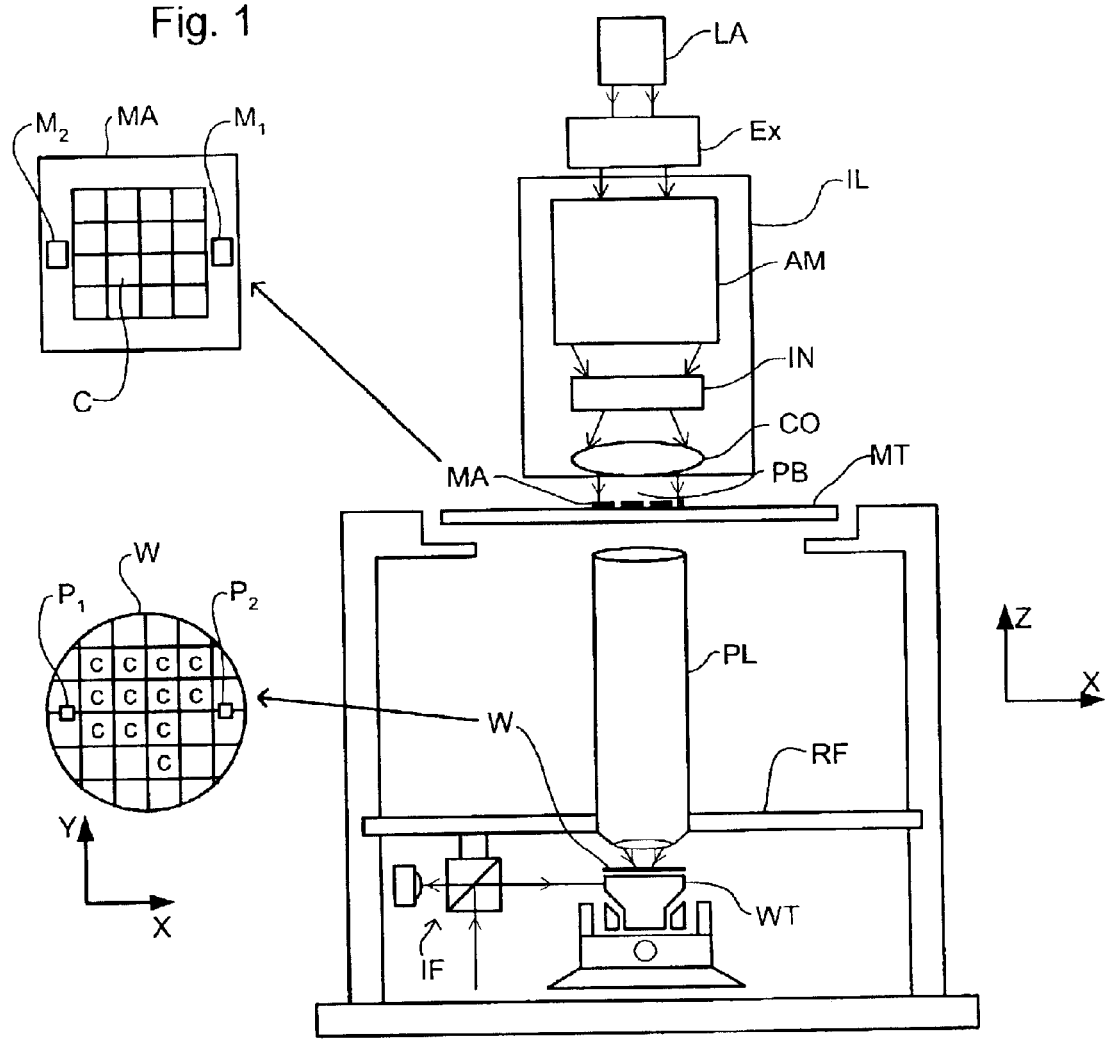
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL constructed and arranged to supply a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). Alternatively, the general it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
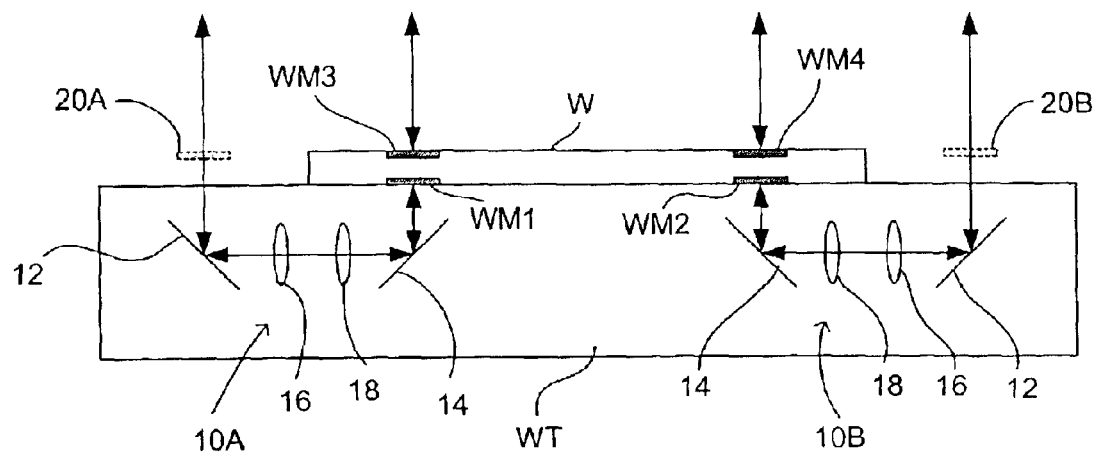
FIG. 2 is a schematic cross section illustrating the substrate table incorporating two branches of an optical system for double side alignment according to an embodiment of the invention.

FIG. 2 shows a wafer W on a wafer table WT. Wafer marks WM3 and WM4 are provided on a first side ("front side") of the wafer W and light can be reflected from these marks, as indicated by the arrows above WM3 and WM4, and used for alignment with marks on a mask in conjunction with an alignment system (not shown) which will be described later. Further wafer marks WM1 and WM2 are provided on the second side ("back side") of the wafer W. An optical system is built into the wafer table WT for providing optical access to the wafer marks WM1, WM2 on the back side of the wafer W. The optical system comprises a pair of arms 10A, 10B. Each arm consists of two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror.

In use, light is directed from above the wafer table WT onto mirror 12, through lenses 16 and 18, onto mirror 14 and then onto the respective wafer mark WM1, WM2. Light is reflected off portions of the wafer mark and returns along the arm of the optical system via mirror 14, lenses 18 and 16 and mirror 12. The mirrors 12, 14 and lenses 16, 18 are arranged such that an image 20A, 20B of the wafer mark WM1, WM2 is formed at the plane of the front (top) surface of the wafer W, corresponding to the vertical position of any wafer marks WM3, WM4 provided on the front side of the wafer W. The order of the lenses 16, 18 and the mirrors 12, 14 can, of course be different, as appropriate to the optical system. For example, lens 18 could be between the mirror 14 and the wafer W.

An image 20A, 20B of a wafer mark WM1, WM2 acts as a virtual wafer mark and can be used for alignment by the pre-existing alignment system (not shown) in exactly the same way as a real wafer mark provided on the front (top) side of the wafer W.

Figure 3:
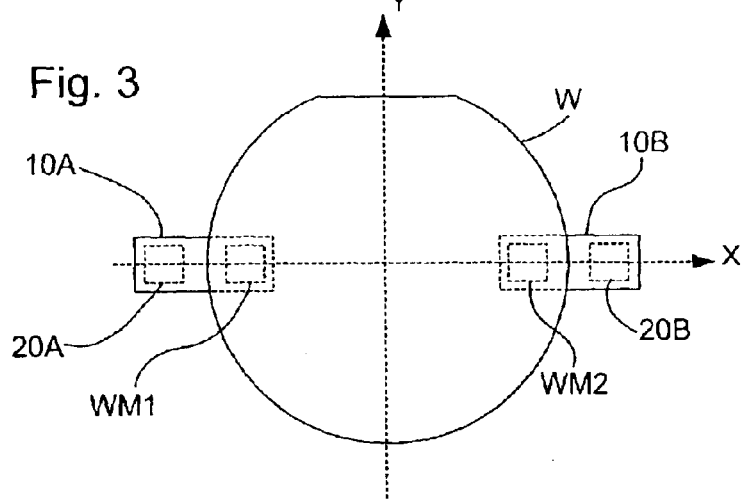
FIG. 3 is a plan view of a wafer showing the position and orientation of the double side alignment optics according to an embodiment of the invention.
Figure 4:
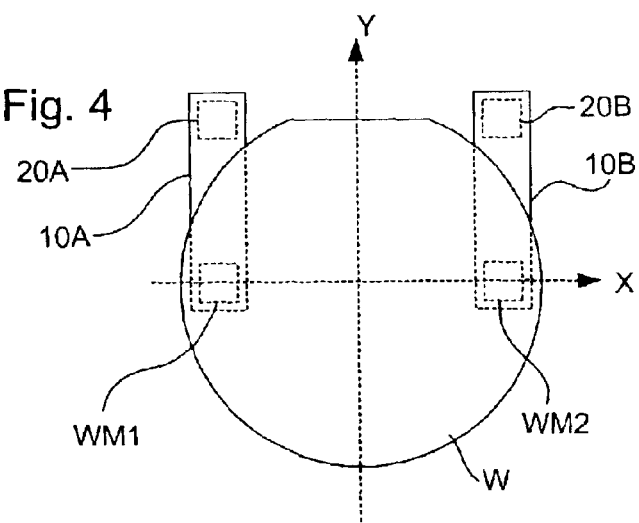
FIG. 4 is plan view showing an alternative position and orientation of the double side alignment optics according to the invention.

As shown in FIG. 2, the arms of the optical system 10A, 10B produce images 20A, 20B which are displaced to the side of the wafer W so that they can be viewed by an alignment system above the wafer W. Two preferred orientations of the arms of the optical system 10A, 10B are shown in FIGS. 3 and 4, which are plan views of the wafer W, which lies in the XY plane. The wafer table WT is omitted from FIGS. 3 and 4 for clarity. In FIG. 3, the arms of the optical system 10A, 10B are aligned along the X axis. In FIG. 4, the arms of the optical system 10A, 10B are parallel to the Y axis. In both cases, the wafer marks WM1, WM2 lie on the X axis. The wafer marks WM1, WM2 are on the underside of the wafer W, so are reversed from the point of view of the top side of the wafer W. However, the arrangement of the mirrors of the arms of the optical system mean that the images 20A, 20B of the wafer marks WM1, WM2 are restored to be the correct way round again, not inverted, so that the images appear exactly the same as if they were on the top side of the wafer W. The optical system is also arranged so that the ratio of the size of a wafer mark WM1, WM2 to its image 20A, 20B is 1:1, i.e. there is no magnification or reduction. Consequently, the images 20A, 20B can be used exactly as if they were real wafer marks on the front side of the wafer W. It will be appreciated that the optics may be arranged to magnify a smaller wafer mark (or reduce a bigger wafer mark) so that the image of the wafer mark is the correct size to allow alignment using the pre-existing alignment system. A common alignment pattern or key provided on a mask can be used to perform alignment with both real and virtual wafer marks.

In the current example, wafer marks are provided on both the front and back sides of the wafer W at corresponding positions, as shown in FIG. 2. In FIGS. 3 and 4, only the wafer marks on the back side of the wafer W are shown, for clarity. According to this arrangement, when the wafer W is flipped over, by rotation about either of the X or Y axes, a wafer mark which was on the top side of the wafer W is now on the underside, but at a position such that it can be imaged by an arm of the optical system 10A, 10B.

It will be noted that, dependent on the arrangement of mirrors and other components of the optical system (in particular whether there are any intermediate images of the marks) movement of the mark in some direction may cause displacement of the image in the opposite direction, while in other directions, the mark and image will move in the same sense. Software controlling the alignment system takes this into account when determining the position of the wafer marks WM1, WM2 and when adjusting the relative positions of the wafer W and a mask when performing alignment.

At least two wafer marks are provided per side of the wafer W. A single mark can give information about the relative positioning of an image of a specific point on a mask to a specific point on the wafer. However, to ensure the correct orientation, alignment and magnification, at least two marks are used.

Figure 5:
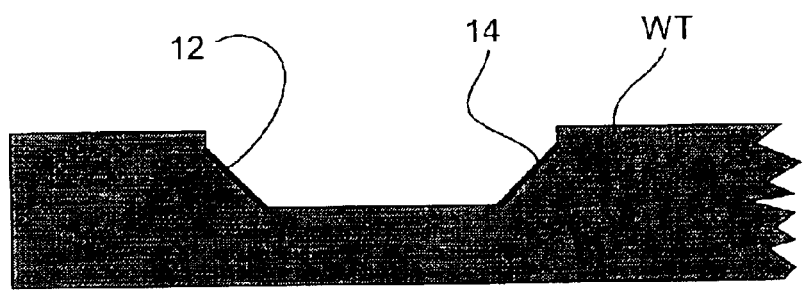
FIG. 5 is a cross section of a portion of a substrate table having integral optical components according to an embodiment of the invention.

FIG. 5 shows a portion of the wafer table WT in cross section. According to this embodiment of the invention, the optical system 10A, 10B for imaging the wafer marks on the back side of a wafer is built into the wafer table in a particular fashion. As shown in FIG. 5, the mirrors 12, 14 of an arm of the optical system are not provided as discrete components, but are integral with the wafer table WT. Appropriate faces are machined into the wafer table WT, which may then be provided with a coating to improve reflectivity, thus forming the mirrors 12, 14. The optical system can be made from the same material as the wafer table, such as ZERODUR®, which has a very low coefficient of thermal expansion and therefore ensures that high alignment accuracy can be maintained.

Further information and alternative forms of the front-to-backside alignment system are described in European patent application number 02250235.5, the contents of which are hereby incorporated by reference.

The front-to-backside alignment system is capable of aligning between alignment marks on opposite sides of a substrate to the desired accuracy but requires calibration.

To calibrate the front-to-backside alignment system it is necessary to know the exact relationship between the position of the front side image of the backside alignment mark as measured by the alignment system and the actual position of the backside alignment mark. This relationship can conveniently be considered as an FTBA offset, representing the distance between a backside marker and its image. To determine the FTBA offset it is necessary to provide a way of determining the position of the backside mark independently of the FTBA alignment system; that determination is then compared to the position as measured by the FTBA alignment system.

It will be noted that the TTL alignment system itself requires calibration to determine the relationship between the measured position of an alignment mark and the position of an image projected by the projection system PL. This calibration is known and forms no part of the present invention. No further description of this calibration is provided.

As will be described below, the present invention provides a method of directly calibrating a FTBA system. However, such a calibration can be time-consuming. Accordingly the present invention also provides a method whereby a lithographic apparatus is calibrated to become a reference machine. The reference machine is then used to manufacture reference substrates (calibration substrates) which can be used to calibrate other machines with a much simpler and quicker method.

As described above, the FTBA system works by projecting an alignment mark that is located on the bottom side of the substrate with an optical system to the same z-level as that of the normal front side markers (top side of substrate). This plane, denoted by z=0, corresponds with the focus plane of the projection lens. By design, the orientation, size and z-level positioning of the backside marker read-out position are, as far as possible, equal to that of the front side marker. Thus the x,y position for a backside alignment scan is determined in the same way as if it is a topside alignment scan. Corrections need to be made for distortion of the optics and the offset correction.

Figure 6A:
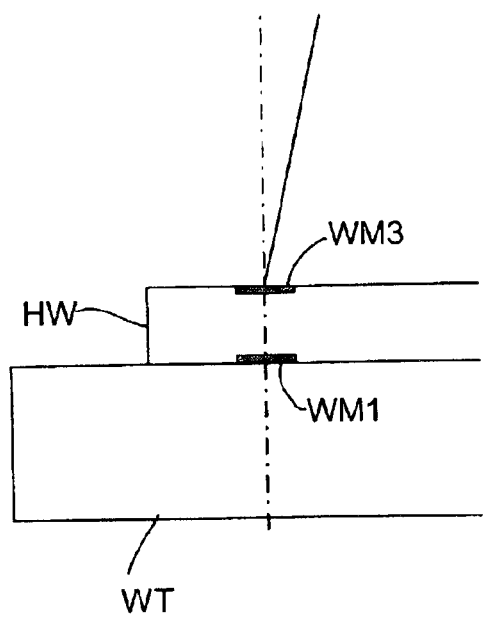
FIGS. 6a and 6b illustrate in cross-section, a substrate table and wafer and scheme for double side alignment according to a further embodiment of the invention.

A procedure for measuring the FTBA offset using a transparent calibration wafer HW is shown in FIGS. 6a and b.

The calibration substrate HW is formed of a transparent material of known thickness, $d_1$, and refractive index n, and has reference markers WM1, WM3 on opposite sides. The calibration wafer is preferably made as thin as possible. Reference marker WM3 should have a visible mirror-image component so as to be detectable through the substrate and appear normal when observed through the FTBA optical system. This is realized either by having two markers, one with each orientation, at known positions from each other or by a so-called omni-marker which combines both orientations into one marker. Reference marker WM1 is preferably constructed in the same way so the wafer can be flipped over. Note that although markers WM1 and WM3 are shown one above the other, in practice they will be side by side.

Figure 6B:
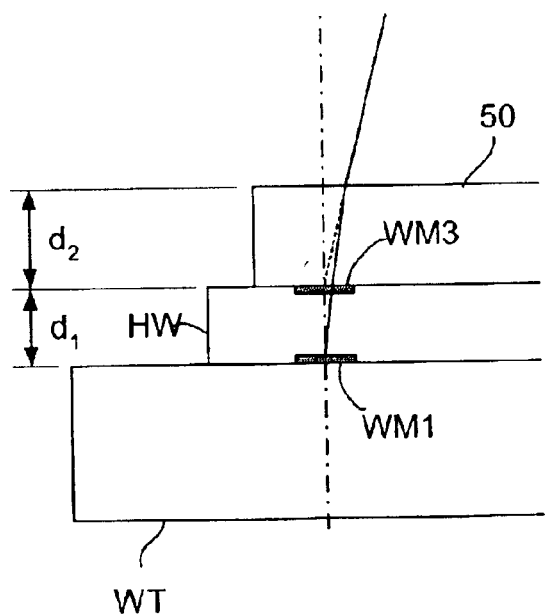

The alignment system determines the position of the reference marker WM3 on the front side of the calibration substrate HW in the usual way, in the situation shown schematically in FIG. 6(a). Then the position of the reference marker WM1 on the back side of the calibration substrate HW is determined by alignment radiation that is transmitted through the calibration substrate HW. However, to compensate for the shift in focus position of marker WM1 with respect to marker WM3, a plane plate 50 of predetermined thickness $d_2$ and refractive index is interposed above the calibration substrate HW, such that marker WM1 appears as if it were at the plane of the front of the calibration substrate HW, as illustrated schematically by the ray construction in FIG. 6(b). Direct comparisons can then simply be made between the actual marker positions on the front side and back side of the calibration substrate HW, whereas previously it was necessary to use a destructive technique such as sawing or etching through the wafer to determine the double sided overlay performance, and even then the measurement errors could exceed the actual overlay accuracy.

It can be shown that, for a calibration substrate HW of refractive index $n_1$ and thickness $d_1$ in an environment with refractive index $n_0$ ($n_0=1$ for vacuum), the refractive index $n_2$ and thickness $d_2$ of the plane plate 50 are determined by the following relationship:

$$d_2 = \frac{n_0 \cdot n_2}{n_1(n_2 - n_0)} \cdot d_1$$

To compensate for any wedge in the plane plate 50, the measurement is repeated after the plane plate 50 has been rotated through 180° about each of three orthogonal axes (x,y,z). Any inhomogeneity of the calibration substrate HW can separately measured using known techniques and an appropriate correction applied. The concept of using a plane plate 50 of predetermined thickness and refractive index is, of course, applicable to any alignment method in which it is desired to shift the focus position of the wafer marker.

The measurement process is iterated using the same wafer, to minimise 'cross-talk' errors between orthogonal axes and the axes of rotation. Typically three iterations are sufficient.

The above scheme can also be used for direct alignment of markers on opposite sides of a production substrate, using radiation for the alignment beam to which the substrate is transparent, for example, infrared radiation with a silicon substrate. Of course, the material chosen for the plane plate must also be transparent to the radiation used in the alignment system.

A second procedure for measuring the FTBA offsets involves a standard silicon substrate and starts with estimates of the offsets. This procedure is illustrated in FIGS. 7a–7d and 8a–8d.

Figure 7A:
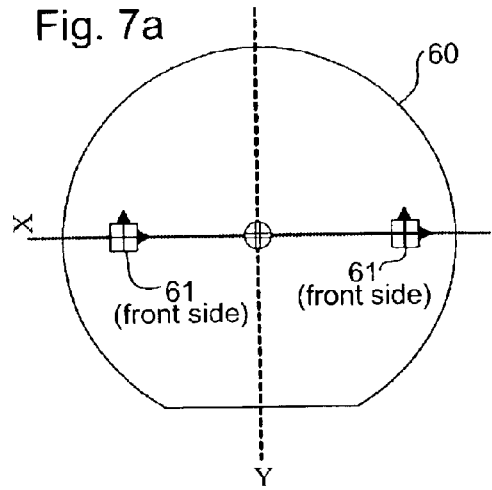
FIGS. 7a–7d illustrate a first calibration process according to the present invention using an opaque substrate.
Figure 7B:
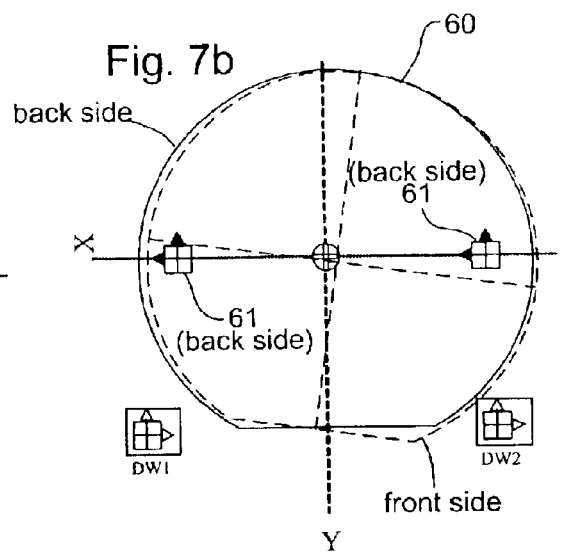
Figure 7C:
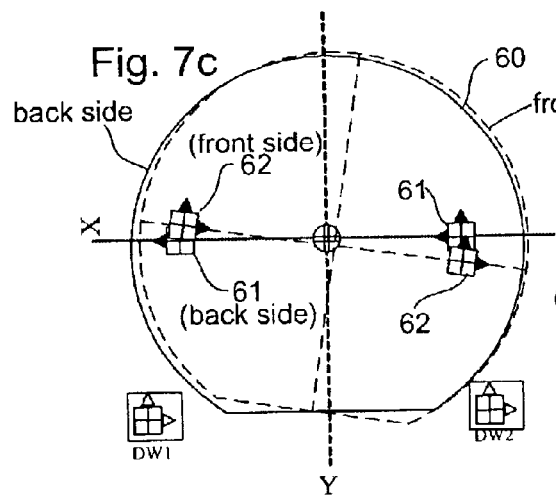
Figure 7D:
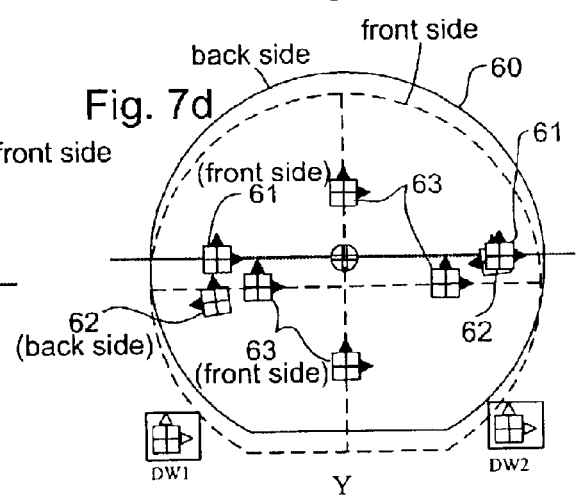

A substrate 60 is exposed with a first set of markers 61. Arrowheads on the markers 60 indicate their orientation. The orientation is necessary as the alignment system is usually only capable of measuring markers with a specific orientation. It will be appreciated that omni-markers which combine more than one orientation into each marker may be used. The locations of the markers are such that they will be visible to the FTBA optics when the wafer is turned over. The markers as exposed are shown in FIG. 7a. The wafer is then turned over (i.e. rotated through 180° about the Y axis), and positioned using the FTBA system and the first set of markers 61 (the first set of markers 61 are now on the backside of the wafer). At this stage, the exact relationship between the front side of the wafer, represented by the dashed lines in FIGS. 7b and 7c, and the backside, is not known. A second set of markers 62 is then exposed on the front side of the wafer (there are no marks on this side of the wafer since it was the backside during the first exposure). The second set of markers 62 is at the estimated position of the first set of markers 61. Finally, the wafer is again rotated by 180° around the Y axis and aligned using the FTBA system and the second set of markers 62, so that a third set of markers 63 can be exposed at a known offset. The difference in y positions of the first and third sets of markers 61, 63 are measured (these sets of markers are both on the front side of the wafer) and the known offset subtracted. This yields the sum of the y-offsets of both branches of the FTBA optical system (i.e. the y-displacement of the center of the measured position of the wafer).

The FTBA x-offset is determined in a similar fashion, illustrated in FIGS. 8a–8d. A wafer 70 is exposed with a fourth set of markers 71 comprising normal markers 71b and rotated markers 71a, shown in FIG. 8a (the orientation of the markers is shown by the arrowheads). The markers 71a and 71b are adjacent each other as shown, with a known separation. This arrangement of markers is required for x-offset detection because the alignment system can only detect markers having a particular orientation. The markers 71b are oriented to allow detection by the front side alignment system. The orientation of the markers 71a is reversed to allow detection via the FTBA optical system once the substrate has been rotated through 180° about the x-axis (i.e. turned over).

Figure 8A:
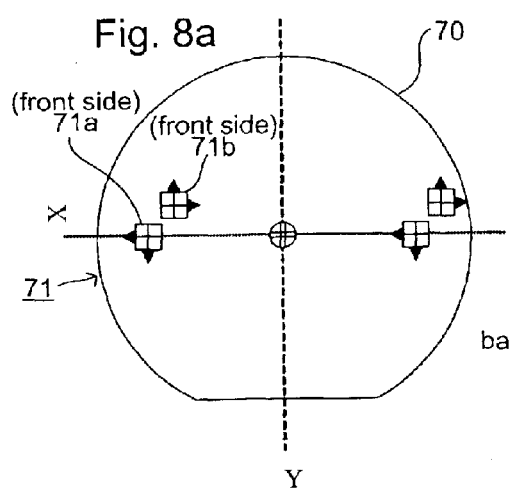
FIGS. 8a–8d illustrate a second calibration process according to the present invention.
Figure 8B:
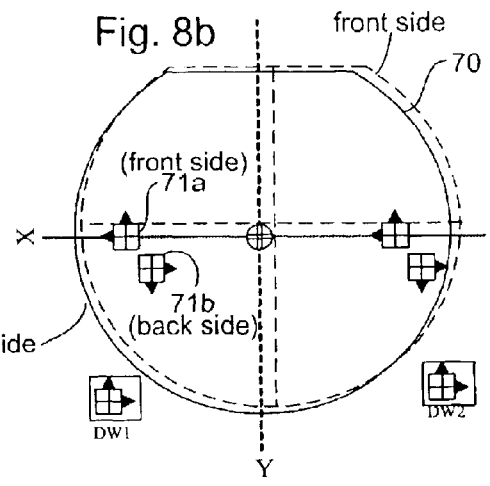
Figure 8C:
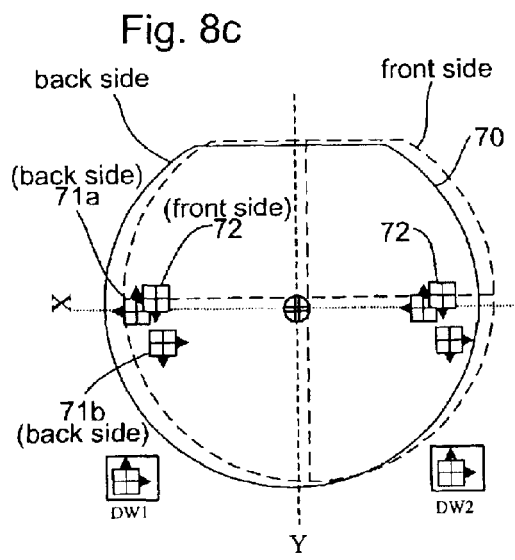
Figure 8D:
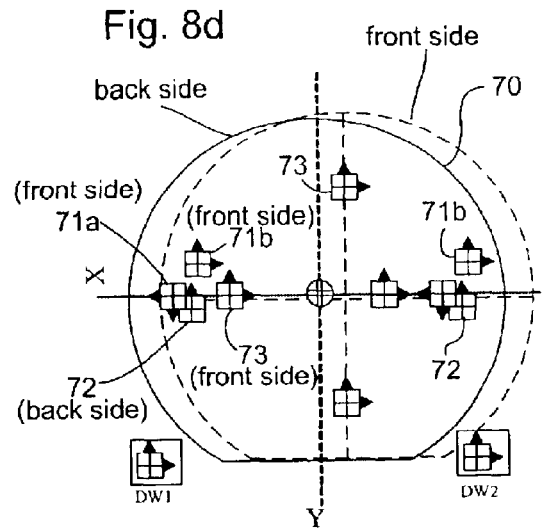

Following exposure, the wafer 70 is rotated around the x axis (i.e. turned over) and aligned using the FTBA system and the rotated markers 71a to reach the situation shown in FIG. 8b. A fifth set of markers 72 is then exposed at the estimated position of the markers 71a as shown in FIG. 8c. The wafer 70 is then rotated again around the x axis. With the wafer aligned by the FTBA system to the fifth set of markers 72, a sixth set of markers 73 is exposed at known offsets.

The difference in x positions of the fourth and sixth sets of markers 71, 73 are measured (these sets of markers are both on the front side of the wafer) and the known offset subtracted. The calculation includes an additional offset which takes account of the separation of the normal markers 71b and rotated markers 71a. This yields the sum of the x-offsets of both branches of the FTBA optical system (i.e. the x-displacement of the center of the measured position of the wafer).

The measurements described and shown in FIGS. 7a–7d and 8a–8d do not provide information regarding rotation of the wafer. This is because the x and y offset measurements are by necessity performed separately. In order to determine, and compensate for, rotation effects a further measurement is needed. This measurement is performed using four rows of marks (not shown) which are positioned to allow imaging via the FTBA optics. Measurement of the positions of the marks before and after turning about the y-axis allows the angular rotation of the wafer to be determined, which in turn allows the y-axis offset to be determined. The rotational measurement is limited by the size of the windows of the FTBA optics. A more accurate rotational measurement may be obtained using the transparent wafer as described in the first method. In practice both the first and second methods may be used, the first to measure rotation and the second to measure x and y offsets.

Figure 9:
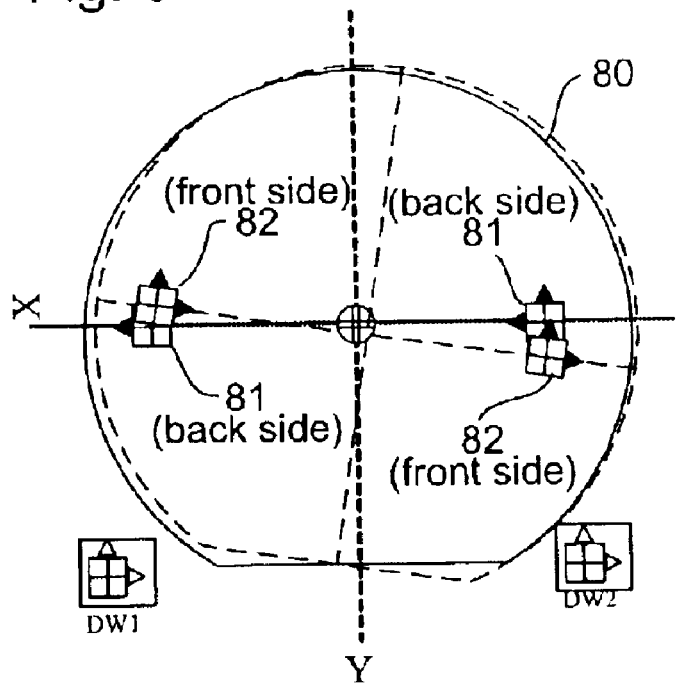
FIG. 9 illustrates a third calibration process according to the present invention.

A third procedure uses a pre-exposed wafer instead of exposing the wafer during the procedure. Referring to FIG. 9, a substrate 80 is provided with a first set of markers 81 on its front side and a second set of markers 82 on its backside. The relative position of the first set of markers 81 relative to the second set of markers 82 is not known. The positions of the front side markers 81 are detected, and the positions of the images of the backside markers 82 (seen via the FTBA optics) are detected. The wafer is rotated through 180° about the y-axis (i.e. turned over), and the positions of the front side markers 82 and the images of the backside markers 81 are detected.

The difference in y positions between the first set of markers 81 and the second set of markers 82 is measured. This yields the sum of the FTBA y-offsets of both branches of the FTBA optical system (i.e. the y-displacement of the center of the measured position of the wafer).

Figure 10:
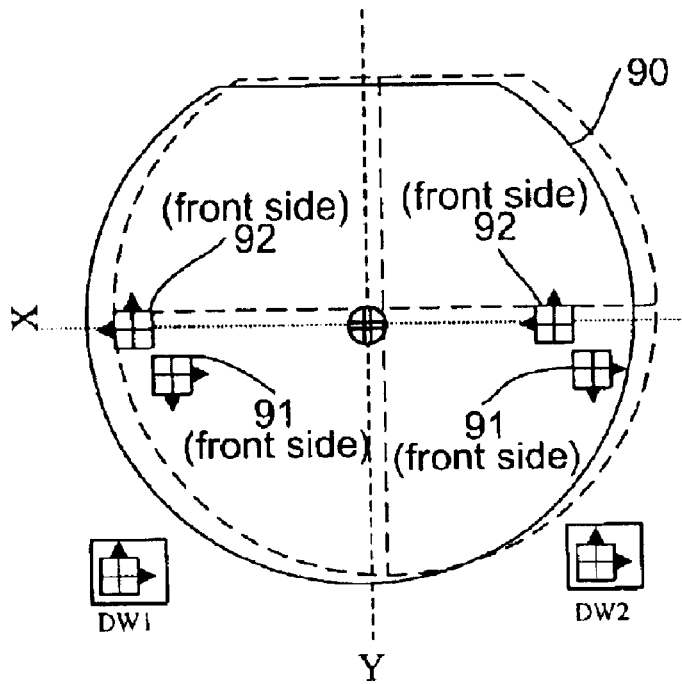
FIG. 10 illustrates a fourth calibration process according to the present invention.

Referring to FIG. 10, a substrate 90 is provided with two sets of markers 91, 92 on its front side. The markers are adjacent each other as shown, with a known separation. The first set of markers 91 is oriented to allow detection by the front side alignment system. The orientation of the second set of markers 92 is reversed to allow detection via the FTBA optical system once the substrate has been rotated through 180° about the x-axis (i.e. turned over). In addition to the markers 91, 92 on the front side, the substrate 90 is also provided with two analogous sets of markers on the backside (not shown in FIG. 10).

The relative positions of the front side markers 91, 92 to the backside markers is not known. The positions of the first set of front side markers 91 are detected, and the positions of the images of a corresponding set of backside markers (seen via the FTBA optics) are detected. The wafer is rotated through 180° about the x-axis (i.e. turned over). The positions of the second set of front side markers 92 are detected, and the positions of the images of the corresponding set of backside markers.

The difference in x positions between the front side markers and the backside markers is measured, taking into account the known separation of adjacent marks. This yields the sum of the FTBA x-offsets of both branches of the FTBA optical system (i.e. the x-displacement of the center of the measured position of the wafer).

A rotation measurement is performed using four rows of marks (not shown) which are positioned to allow imaging via the FTBA optics, as described above in relation to the second method.

The third procedure may be repeated several times, to minimise 'cross-talk' errors between orthogonal axes and the axes of rotation. Typically three iterations are sufficient. The second procedure may be immediately followed by the third procedure, the third procedure providing iterative measurement of marks exposed during the first procedure.

The second and third procedures provide a more accurate measurement of the x and y offsets of the FTBA system than the first procedure but, although the rotation error can be measured by using pre-alignment marks, the accuracy of this is low because of the small viewing window of the FTBA optics. The calibration process using a glass substrate on the other hand, has a less accurate measurement of the x and y position offsets, due to inhomogeneity in the glass, but provides a more accurate measurement of the rotation offset due to the long arm between the two branches. Thus a combination of the two methods can be used to advantage to fully calibrate a reference machine.

A fourth procedure for calibrating a reference machine uses an ultra-thin substrate. The ultra-thin substrate is provided with a reference marker, e.g. of the omni-marker type referred to above, such that it can be read directly from both sides due to the thinness of the wafer. For this, the substrate may be of the order of 10 $\mu$m thin or less, compared to a thickness of 500 $\mu$m for a normal wafer.

With the ultra-thin substrate, measuring the position of the marker directly and through the FTBA optical system gives the FTBA offsets directly, subject only to any error due to the non-normal angle of incidence of the alignment beam. This can be compensated for using plane plates, as described for the first method, or the error calculated from focus-depth calibrations and subtracted.

The ultra-thin calibration wafer need only be thin in the region of the reference marker. Thus the ultra-thin calibration wafer may be constructed by etching a trough in a relatively thick wafer and then etching the reference mark in the bottom of that trough. Alternatively, a piece of suitable material of the desired thickness can be glued over a through-hole in a thicker substrate.

A calibration wafer having ultra-thin regions may be used to eliminate the error caused by the non-normal angle of incidence of the alignment beam. The calibration wafer is provided with ultra-thin regions at its front side surface, and adjacent ultra thin regions at its backside surface. Rotating the wafer around the z-axis (n.b. not turning the wafer over) allows the error due to the non-normal angle of incidence of the alignment beam to be determined.

A fifth procedure for calibrating a reference machine involves exposing markers on both sides of a standard wafer. The positions of the markers are determined directly and using the FTBA optical system using nominal offset values. The wafer is turned over and the measurement repeated. The wafer is then cut up and the relative positions of the markers on the opposite sides of the wafer are determined using a scanning electron microscope.

Where suitable, any of the above methods may be iterated, using the same wafer, to minimise 'cross-talk' errors between orthogonal axes and the axes of rotation. Typically three iterations are sufficient.

Once a reference machine has been calibrated it is a simple matter to fabricate wafers having markers on both sides and measure the exact positional relationship between the front and backside markers. These reference wafers are called "holy wafers" and can then be used to calibrate directly the FTBA systems of other machines. The relative positions of the front and backside reference markers are measured with the FTBA system to be calibrated and the results and compared to the known relative positions giving directly the FTBA offsets.

Some alignment schemes using the FTBA system will now be outlined.

When using FTBA to align images only on the front side, the pre-alignment marks do not have to be in alignment with the images themselves. So if only one machine is in use it does not need a precise FTBA offset calibration. It is not important to know where the backside alignment mark is with respect to the front side patterns. If more than one machine is to be used, the first adjusted machine can be called "holy" and used to make "holy wafers" to adjust all other machines. For exposures, the process is then:

Expose pre-alignment marks on the backside and etch them into the wafer.

Perform the normal exposure and process as with product on the front side, but using the backside marks for alignment.

When using FTBA to align images on both sides, the pre-alignment marks have to be in alignment with the images themselves. Accordingly a full calibration is performed and the following procedure adopted for exposures:

Expose pre-alignment marks on the front-side and etch them into the wafer.

Perform the normal exposure and process as with product on the front side, using the front-side marks to align on.

Flip over the wafer. (Backside becomes front-side and front-side becomes backside.)

Perform the normal exposure and process as with product on the front side, but using the backside marks (the front side marks of the first exposure) to align on.

When using FTBA to align images on three sides, two sides of a first wafer and one side of a second wafer bonded to the first, the pre-alignment marks again have to be in alignment wit the images themselves. A full calibration is performed and the following procedure adopted for exposures:

Expose pre-alignment marks on the front-side and etch them into the wafer.

Perform the normal exposure and process as with product on the front side, using the front-side marks to align on.

Flip over the wafer. (Backside becomes front-side and front-side becomes backside.)

Perform the normal exposure and process as with product on the front side, but using the backside marks to align on.

Bond a thin wafer on the front-side. (Front-side becomes bonded-side.)

Perform the normal exposure and process as with product on the bonded-side, but using the backside marks to align on.

While specific embodiments of the invention have been described above, it will be appreciated that the invention may be practiced otherwise than as described. The description is not intended to limit the invention.

What is claimed is:

1. A method of calibrating an alignment system capable of aligning to alignment markers on opposite sides of a substrate, the alignment system directing an alignment beam of radiation directly onto one side and directing the alignment beam onto the other side via an optical system, the method comprising:

providing a calibration substrate having first and second opposite surfaces and being transparent to the radiation of the alignment beam, the calibration substrate having a reference marker on a first surface thereof, the reference marker being detectable from both the first and second surfaces;

performing a first alignment to the reference marker with the alignment beam directed onto the first surface; and performing a second alignment to the reference marker with the alignment beam directed onto the second surface and propagating through the calibration substrate to the first surface, while a plane plate is interposed into the alignment beam so that a focal position of the alignment system is displaced to the position of the first marker;

wherein the first and second alignments may be performed in any order.

2. A method according to claim 1, comprising the further steps of rotating the plane plate by 180° about three orthogonal axes and repeating the second alignment after each rotation.

3. A method according to claim 1, wherein the first alignment is performed via the optical system.

4. A calibration substrate for use in a method according to claim 1, comprising a transparent body having a reference marker on one of two opposite surfaces thereof, the reference marker being detectable from both of the opposite surfaces.

5. A calibration substrate according to claim 4, wherein the alignment marker comprises diffraction gratings.

6. A method of calibrating an alignment system in a lithographic apparatus capable of aligning to alignment markers on opposite sides of a substrate, the alignment system directing an alignment beam of radiation directly onto one side and directing the alignment beam onto the other side via an optical system, the method comprising:

providing a substrate having a pair of first reference markers on a first surface thereof;

performing a first alignment to the pair of first reference markers using the optical system, performing a first exposure of a pair of second reference markers on a second surface of the substrate;

performing a first rotation of the substrate by 180° about a first axis;

performing a second alignment to the pair of second reference markers using the optical system;

performing a second exposure of a pair of third reference markers on the first surface of the substrate; and measuring the relative positions of the first and third pair of reference markers to calibrate the alignment system.

7. A method according to claim 6, further comprising measuring the positions of the pair of second reference markers using the optical system.

8. A method according to claim 6, wherein the first axis is a perpendicular bisector of a line joining the pair of first reference markers.

9. A method according to claim 6, wherein the first axis is a line joining the pair of first reference markers.

10. A method of calibrating a lithographic apparatus including an alignment system capable of aligning to alignment markers on opposite sides of a substrate, the alignment system directing an alignment beam of radiation directly onto one side and directing the alignment beam onto the other side via an optical system, the method comprising:

providing a calibration substrate having first and second opposite surfaces and being transparent to the radiation of the alignment beam, the calibration substrate having a reference marker on a first surface thereof, the reference marker being detectable from both the first and second surfaces;

performing a first alignment to the reference marker with the alignment beam directed onto the first surface;

performing a second alignment to the reference marker with the alignment beam directed onto the second surface and propagating through the calibration substrate to the first surface, while a plane plate is interposed into the alignment beam so that a focal position of the alignment system is displaced to the position of the first marker, wherein the first and second alignments may be performed in any order;

providing a substrate having a pair of first reference markers on a first surface thereof;

performing a first alignment to the pair of first reference markers using the optical system, performing a first exposure of a pair of second reference markers on a second surface of the substrate;

performing a first rotation of the substrate by 180° about a first axis;

performing a second alignment to the pair of second reference markers using the optical system;

performing a second exposure of a pair of third reference markers on the first surface of the substrate; and measuring the relative positions of the first and third reference markers to calibrate the alignment system.

11. A method of calibrating an alignment system in a lithographic apparatus capable of aligning to alignment markers on opposite sides of a substrate, the alignment system directing an alignment beam of radiation directly onto one side and directing the alignment beam onto the other side via an optical system, the method comprising:

providing a substrate having a pair of first reference markers on a first surface thereof and a pair of second reference markers on a second surface thereof;

performing an alignment to the first reference marks with the alignment beam directed onto the surface;

performing an alignment to the second reference marks using the optical system;

performing a first rotation of the substrate by 180° about a first axis;

performing an alignment to the second reference marks with the alignment beam directed onto the surface, performing an alignment to the first reference marks using the optical system; and comparing the alignments, wherein the alignments may be performed in any order.

12. A method according to claim 11, wherein the first axis is the perpendicular bisector of a line joining the pair of first reference markers.

13. A method according to claim 12, wherein the first axis is a line joining the pair of first reference markers.

14. A method of calibrating a lithographic apparatus including an alignment system capable of aligning to alignment markers on opposite sides of a substrate, the alignment system directing an alignment beam of radiation directly onto one side and directing the alignment beam onto the other side via an optical system, the method comprising:

providing a calibration substrate having first and second opposite surfaces and being transparent to the radiation of the alignment beam, the calibration substrate having a reference marker on a first surface thereof, the reference marker being detectable from both the first and second surfaces;

performing a first alignment to the reference marker with the alignment beam directed onto the first surface;

performing a second alignment to the reference marker with the alignment beam directed onto the second surface and propagating through the calibration substrate to the first surface, while a plane plate is interposed into the alignment beam so that a focal position of the alignment system is displaced to the position of the first marker, wherein the first and second alignments may be performed in any order;

providing a substrate having a pair of first reference markers on a first surface thereof and a pair of second reference markers on a second surface thereof;

performing an alignment to the first reference marks with the alignment beam directed onto the surface;

performing an alignment to the second reference marks using the additional optical system;

performing a first rotation of the substrate by 180° about a first axis;

performing an alignment to the second reference marks with the alignment beam directed onto the surface, performing an alignment to the first reference marks using the system; and comparing the alignments, wherein the alignments may be performed in any order.

15. A method of calibrating a lithographic apparatus including an alignment system capable of aligning to alignment markers on opposite sides of a substrate, the alignment system directing an alignment beam of radiation directly onto one side and directing the alignment beam onto the other side via an optical system, the method comprising;

providing a substrate having a pair of first reference markers on a first surface thereof and a pair of second reference markers on a second surface thereof;

performing a first alignment to the pair of first reference markers using the optical system, performing a first exposure of the pair of second reference markers on the second surface of the substrate;

performing a first rotation of the substrate by 180° about a first axis;

performing a second alignment to the pair of second reference markers using the optical system;

performing a second exposure of a pair of third reference markers on the first surface of the substrate;

measuring the relative positions of the first and third reference markers to calibrate the alignment system;

performing an alignment to the first reference marks with the alignment beam directed onto the surface;

performing an alignment to the second reference marks using the optical system;

performing a first rotation of the substrate by 180° about a first axis;

performing an alignment to the second reference marks with the alignment beam directed onto the surface, performing an alignment to the first reference marks using the optical system; and comparing the alignments, wherein the alignments may be performed in any order.

16. A method of calibrating an alignment system in a lithographic apparatus capable of aligning to alignment markers on opposite sides of a substrate, the alignment system directing an alignment beam of radiation directly onto one side and directing the alignment beam onto the other side via an additional optical system, the method comprising:

providing a calibration substrate having a first pair of rows of three or more reference markers on a first surface thereof, and a second pair of rows of three or more reference markers on a second surface thereof;

performing an alignment to the first pair of rows of reference marks using the directly incident alignment radiation, and performing an alignment to the second pair of rows of reference marks using the optical system;

performing a first rotation of the substrate by 180° about a first axis;

performing an alignment to the second pair of rows of reference marks using the directly incident alignment radiation, and performing an alignment to the first pair of rows of reference marks using the additional optical system; and comparing the alignments, wherein the alignments may be performed in any order.

17. A method of calibrating a lithographic apparatus an alignment system in a capable of aligning to alignment markers on opposite sides of a substrate, the alignment system directing an alignment beam of radiation directly onto one side and directing the alignment beam onto the other side via an additional optical system, the method comprising:

providing a calibration substrate having a first pair of rows of three or more reference markers on a first surface thereof, and a second pair of rows of three or more reference markers on a second surface thereof;

performing an alignment to the first pair of rows of reference marks using the directly incident alignment radiation, and performing an alignment to the second pair of rows of reference marks using the optical system;

performing a first rotation of the substrate by 180° about a first axis;

performing an alignment to the second pair of rows of reference marks using the directly incident alignment radiation, and performing an alignment to the first pair of rows of reference marks using the additional optical system;

comparing the alignments, wherein the alignments may be performed in any order;

providing a substrate having a pair of first reference markers on a first surface thereof;

performing a first alignment to the pair of first reference markers using the optical system;

performing a first exposure of a pair of second reference markers on a second surface of the substrate;

performing a first rotation of the substrate by 180° about a first axis;

performing a second alignment to the pair of second reference markers using the optical system;

performing a second exposure of a pair of third reference markers on the first surface of the substrate; and measuring the relative positions of the first and third reference markers to calibrate the alignment system.

18. A method of calibrating a lithographic apparatus having an alignment system capable of aligning to alignment markers on opposite sides of a substrate, the alignment system directing an alignment beam of radiation directly onto one side and directing the alignment beam onto the other side via an additional optical system, the method comprising:

calibrating a reference lithographic apparatus using the method of any one of claims 1, 6, 10, 11, 15, or 17;

using the reference lithographic apparatus to determine the positional relations ship of first and second reference markers on a calibration substrate, the first and second markers being on opposite surfaces of the calibration substrate; and using the calibration substrate to calibrate the lithographic apparatus.

19. A calibration substrate for use in the method of claim 18 having first and second reference markers on opposite sides thereof in combination with information indicating the positional relationship of the first and second reference markers.

20. A device manufacturing method, comprising:

providing a beam of radiation using a radiation system;

using a patterning device to endow the beam of radiation with a pattern in its cross-section;

projecting the patterned beam of radiation onto a target area of a layer of radiation-sensitive material on a first side of the substrate, calibrating an alignment system by the method of any one of claims 1, 6, 10, 11, 15, 17, and using the alignment system to align a reference marker on a support configured to support the patterning device or the patterning device with alignment markers provided on opposite sides of the substrate prior to projecting.

21. A lithographic projection apparatus comprising:

a radiation system constructed and arranged to supply a beam of radiation;

a patterning device constructed and arranged to pattern the beam of radiation according to a desired pattern;

a substrate table constructed and arranged to hold a substrate;

a projection system constructed and arranged to project the patterned beam onto a target portion on a first side of the substrate;

an alignment system employing an alignment beam of radiation to which the substrate is transparent constructed and arranged to align a reference marker on a support configured to support the patterning device or the patterning device to an alignment marker provided on a first surface of the substrate onto which the patterned beam is to be imaged;

a plane plate selectively interposable into the path of the alignment beam such that the alignment beam is focused onto a second surface of the substrate opposite to e first surface.

22. A device manufacturing method, comprising:

providing a beam of radiation using a radiation system;

using a patterning device to endow the beam of radiation with a pattern in its cross-section;

using an alignment system to align a reference marker on a support configured to support the patterning device or the patterning device with a first alignment marker provided on a first surface of the substrate onto which the patterned beam is to be imaged by illuminating the alignment marker with a beam of radiation to which the substrate is transparent;

interposing a plane plate into the path of the alignment beam such than the alignment beam is focused onto a second surface of the substrate opposite to the first surface and aligning the reference marker with a second alignment marker provided on a second surface of the substrate opposite the first surface; and projecting the patterned beam of radiation onto a target area of layer of radiation-sensitive material on a first side of the substrate.

23. A calibration substrate having a thickness of less than or equal 10 $\mu$m, at least in the vicinity of an alignment marker, such that the alignment marker is detectable from both sides.

24. A calibration substrate according to claim 23, wherein the substrate is provided with a first region having a thickness of less than or equal to 10 $\mu$m and provided with a first alignment marker, and a second region having a thickness of less than or equal to 10 $\mu$m and provided with a second alignment marker, the first and second regions being separated in a direction perpendicular to a plane defined by a surface of the substrate.

25. A calibration substrate according to claim 24, wherein the separation is greater than 100 $\mu$m.

26. A method of calibrating a lithographic apparatus, comprising performing the method of claim 1 using a calibration substrate having a thickness of less than or equal to 10 $\mu$m, at least in the vicinity of an alignment marker, such that the alignment marker is detectable from both sides;

rotating the substrate about an axis perpendicular to a plane defined by surface of the substrate; and performing the method for a second time.

* * * * *